(12) United States Patent
Uratsuji

(10) Patent No.: US 6,824,395 B2
(45) Date of Patent: Nov. 30, 2004

(54) SEMICONDUCTOR DEVICE-SOCKET

(75) Inventor: Kazumi Uratsuji, Tokyo (JP)

(73) Assignee: Yamaichi Electronics Co., Ltd., Tokyo (JP)

(*) Notice: Subject to any disclaimer, the term of this patent is extended or adjusted under 35 U.S.C. 154(b) by 0 days.

(21) Appl. No.: 10/167,433

(22) Filed: Jun. 13, 2002

(65) Prior Publication Data
US 2002/0192987 A1 Dec. 19, 2002

(30) Foreign Application Priority Data
Jun. 14, 2001 (JP) ........................................ 2001-180576

(51) Int. Cl.⁷ .............................................. H01R 12/00
(52) U.S. Cl. ...................... 439/70; 439/266; 439/330
(58) Field of Search ............................. 439/70, 68, 55, 439/525, 526, 264, 862, 72, 390, 266

(56) References Cited

U.S. PATENT DOCUMENTS

| 4,417,777 | A | * | 11/1983 | Bamford | 439/70 |
| 4,786,256 | A | * | 11/1988 | Angeleri et al. | 439/72 |
| 6,036,503 | A | * | 3/2000 | Tsuchida | 439/70 |
| 6,142,808 | A | * | 11/2000 | Mori | 439/266 |
| 6,344,753 | B1 | * | 2/2002 | Takada et al. | 324/755 |
| 6,447,318 | B1 | * | 9/2002 | Okamoto | 439/266 |

* cited by examiner

Primary Examiner—P. Austin Bradley
Assistant Examiner—Edwin A. Leon
(74) Attorney, Agent, or Firm—Finnegan, Henderson, Farabow, Garrett & Dunner, LLP

(57) ABSTRACT

A semiconductor device-socket is provided, in which a partition wall for dividing slits engaged with a contact portion of a contact terminal in an object under test-accommodation member has a slope for guiding leads of a semiconductor device onto the contact portion of an adjacent contact terminal.

13 Claims, 9 Drawing Sheets

SEMICONDUCTOR DEVICE-SOCKET

This application is based on Patent Application No. 2001-180576 filed Jun. 14, 2001 in Japan, the content of which is incorporated hereinto by reference.

BACKGROUND OF THE INVENTION

1. Field of the Invention

The present invention relates to a semiconductor device-socket used for testing the semiconductor device.

2. Description of the Related Art

Semiconductor devices mounted on an electronic equipment or others are subjected to various tests at a stage prior to being actually mounted so that latent defects therein are removed. The test is performed nondestructively under conditions such as application of voltage stress, high-temperature operation, and high-temperature storage, corresponding to thermal and mechanical environment tests or the like.

A semiconductor device-socket made available for such tests comprises, as illustrated in FIG. 7 and FIG. 8 for example, a base 2 disposed on a printed circuit board 4 that includes an input/output section through which a predetermined inspection signal is inputted and outputted, an object under test-accommodation member 6, which is disposed on the base 2 for accommodating a semiconductor device 12 as a specimen to be inspected, and a plurality of contact terminals 10$ai$ (i=1 to n, n is a positive integer) each for electric connection between each lead of the semiconductor device 12 accommodated in the object under test-accommodation member 6 and each electrode of the printed circuit board 4, as the main components.

The base 2 includes mounting holes 2$a$ in four places into each of which a screw is inserted. Screws are used to fix the base section 2 onto the printed circuit board 4. The base 2 includes openings 2$b$ provided in four places in the center of itself, into each of which openings each of pawls 6A, 6B, 6C, and 6D of the object under test-accommodation member 6 described later is inserted. Around a peripheral edge of each opening 2$b$ a pawl 2N is provided, which is engaged with the foregoing pawls 6A, 6B, 6C, and 6D.

A thin sheet-shaped contact terminal 10$ai$ comprises a board-side terminal fixed to the electrode of the printed circuit board 4, a contact portion in contact with each lead of the semiconductor device 12 described later, and a curved coupling section for coupling the board-side terminal to the contact portion. The contact terminals 10$ai$ on each line are disposed oppositely to each other, across the object under test-accommodation member 6 at a predetermined mutual distance. Further, the contact terminals 10$ai$ are arranged longitudinally of the object under test-accommodation member 6. The board-side terminal is fixed to the inside of the base 2, and contact portions of the board-side, on the other hand, are inserted into and engaged with a groove in the object under test-accommodation member 6 described later.

The object under test-accommodation member 6 includes the four pawls 6A to 6B at its lower end corresponding to the opening 2$b$. The pawls 6A to 6B are protruded toward the inside of the opening 2$b$. Between the object under test-accommodation member 6 and the base 2 are provided coiled springs 8A and 8B each for supporting the object under test-accommodation member 6.

The object under test-accommodation member 6 includes at the center thereof a accommodating section 14 in which the semiconductor device 12 is accommodated. The accommodating section 14 is surrounded by an inclined guide surface 14$s$, a bottom surface 14$b$ that forms the bottom of the accommodating section 14, and each upright surface 14$f$ that intersects with the guide surface 14$s$ and the bottom surface 14$b$. In a portion of an outer peripheral section of the accommodating section 14 of the object under test-accommodation member 6 opposing the contact terminals 10$ai$ on each line is formed a slit 6$gi$ (i=1 to n, n is a positive integer, with which the contact portions of the contact terminals 10$ai$ are engaged. The slit 6$gi$ is formed between adjacent partition walls at a predetermined interval therebetween.

In such a construction, when the semiconductor device 12 is tested, the semiconductor device 12 held by a conveying robot (not shown) is disposed in place directly over the accommodating section 14 of the object under test-accommodation member 6, and is thereafter dropped down from a predetermined height and is mounted on the accommodating section 14 as indicated by a chain double-dashed line in FIG. 8. Each lead of the semiconductor device 12 is thus placed on the contact portion of each contact terminal 10$ai$.

Referring here to FIG. 9 for example, when the semiconductor device 12 is dropped down in a slanting position from a predetermined height in error for some reason, the end portion of the semiconductor device 12 is guided to the guide surface 14$s$ of the accommodating section 14, and simultaneously the lead 12$c$ of the semiconductor device 12 is made to slide on the upper surface of the partition wall and on the contact portions of the contact terminals 10$ai$, and thereafter the semiconductor device 12 is positioned in place.

However, as illustrated in FIG. 9, when the semiconductor device 12 is dropped in a slanting position, the lead 12$c$ of the semiconductor device 12 is caught on a step Da in size as small as about several tens of micrometers between the contact portion surface 10$s$ of the contact portion of the contact terminal 10$ai$ and an upper surface of the partition wall between the adjacent slits 6$gi$. As a consequence, the semiconductor device 12 may no longer be positioned in place within the accommodating section 14.

In such a situation, since it may be contemplated that such a step Da happens on the basis of the manufacturing error involving assembling error, and hence it is reasonable to take measures to reduce the manufacturing error to a minimum so that a surface formed by the contact surface 10$s$ of the contact portion of the contact terminal 10$ai$ and the upper surface of the partition wall between the adjacent slits 6$gi$ are flush with each other. However, this causes increasing manufacturing costs, and as the position of the contact portion surface 10$s$ of the contact portion of the contact terminal 10$ai$ is varied vertically, it is not easy to limit the size of the step Da within several tens of micrometers, in actual fact, that is close to impossible.

SUMMARY OF THE INVENTION

In view of the aforementioned problems with the prior art, it is an object of the present invention to provide a semiconductor device-socket for use in a test on the semiconductor device, wherein it is capable of securely guiding a lead of the semiconductor device to be mounted in place in a contact portion of a contact terminal when the semiconductor device is mounted.

To achieve the above object, according to an aspect of the present invention, there is provided a semiconductor device-socket comprising: a plurality of slits each of which is formed around a semiconductor device accommodating section in which the semiconductor device including a plurality of leads are accommodated, corresponding to an array of the leads, the slit engaged with contact terminals including the contact portions electrically connected with the leads respectively; and a plurality of partition walls formed around the semiconductor device accommodating section as to continue on the plurality of the slits and dividing the adjacent slits, wherein at least the one partition wall among the foregoing plurality of the partition walls has a slope that connects the uppermost end located at a higher position than the position of a contact portion of a first contact terminal among the contact terminals and the lowest end located at a lowest position than the position of the contact portion of a second contact terminal adjacent to the first contact terminal.

According to an aspect of the present invention, there is provided a semiconductor device-socket comprising: a plurality of contact terminals each having contact portion electrically connected to each lead of a semiconductor device including a plurality of leads; an object under test-accommodation member including: a semiconductor device accommodating section in which the semiconductor device is accommodated; a plurality of slits formed around the semiconductor device accommodating section corresponding to an array of the leads, and each engaged with the contact terminals; a plurality of partition walls each formed as to continue on the plurality of slits for dividing between the adjacent slits; and a base for supporting the contact terminals and the object under test-accommodation member, wherein at least the one partition wall among the plurality of the partition walls has a slope that couples the uppermost end located at a higher position than the position of the contact portion of a first contact terminals among the contact terminals and a lowest end located at a lower position than the position of the contact portion of an adjacent second contact terminal adjacent to the first contact terminal.

The slope of the partition wall may be formed at a portion accommodating section corresponding to the vicinity of at least one end around the semiconductor device accommodating section in direction of an array of the plurality of the slits.

The semiconductor device accommodating section may include a guide surface for guiding and introducing a semiconductor device to be accommodated.

As clarified from the aforementioned description, in accordance with the semiconductor device-socket of the present invention, at least the one partition wall among the plurality of the partition walls has a slope connecting the uppermost end located at a higher position than the position of the contact point of the first contact terminal among the contact terminals and the lowest end located at a lower position than the position of the contact portion of the second contact terminal adjacent to the first contact terminal, so that upon the semiconductor device being mounted, even if the lead falls on the partition wall by mistake, the lead is guided in conformity with the slope onto the contact portion of the first contact terminal, whereby the lead of the semiconductor device to be mounted can be securely guided to a predetermined position.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2:
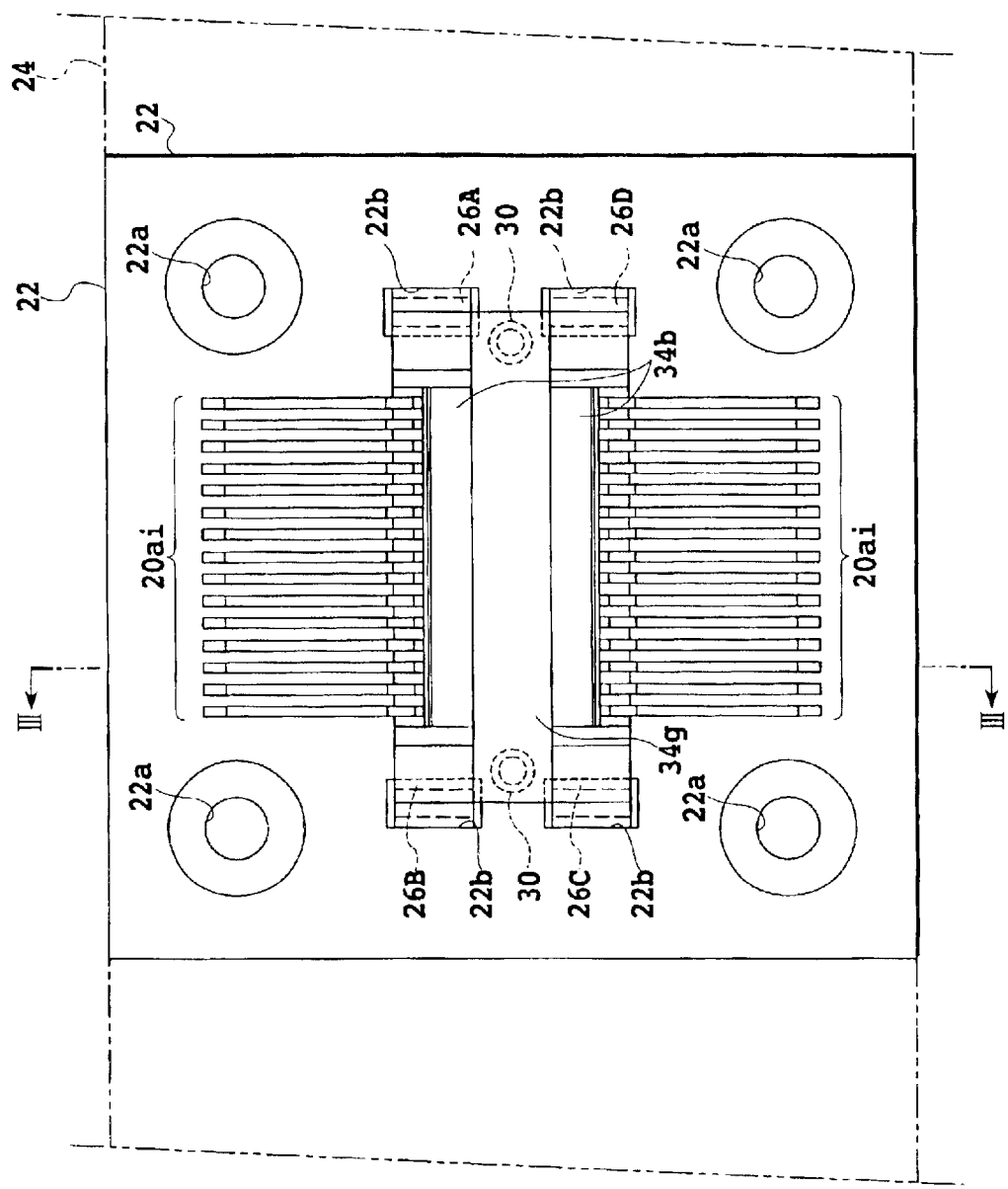
FIG. 2 is a plan view illustrating an outer appearance of an embodiment of the semiconductor device-socket according to the present invention.

FIG. 2 illustrates an outer appearance of an embodiment of a semiconductor device-socket according to the present invention.

Figure 3:
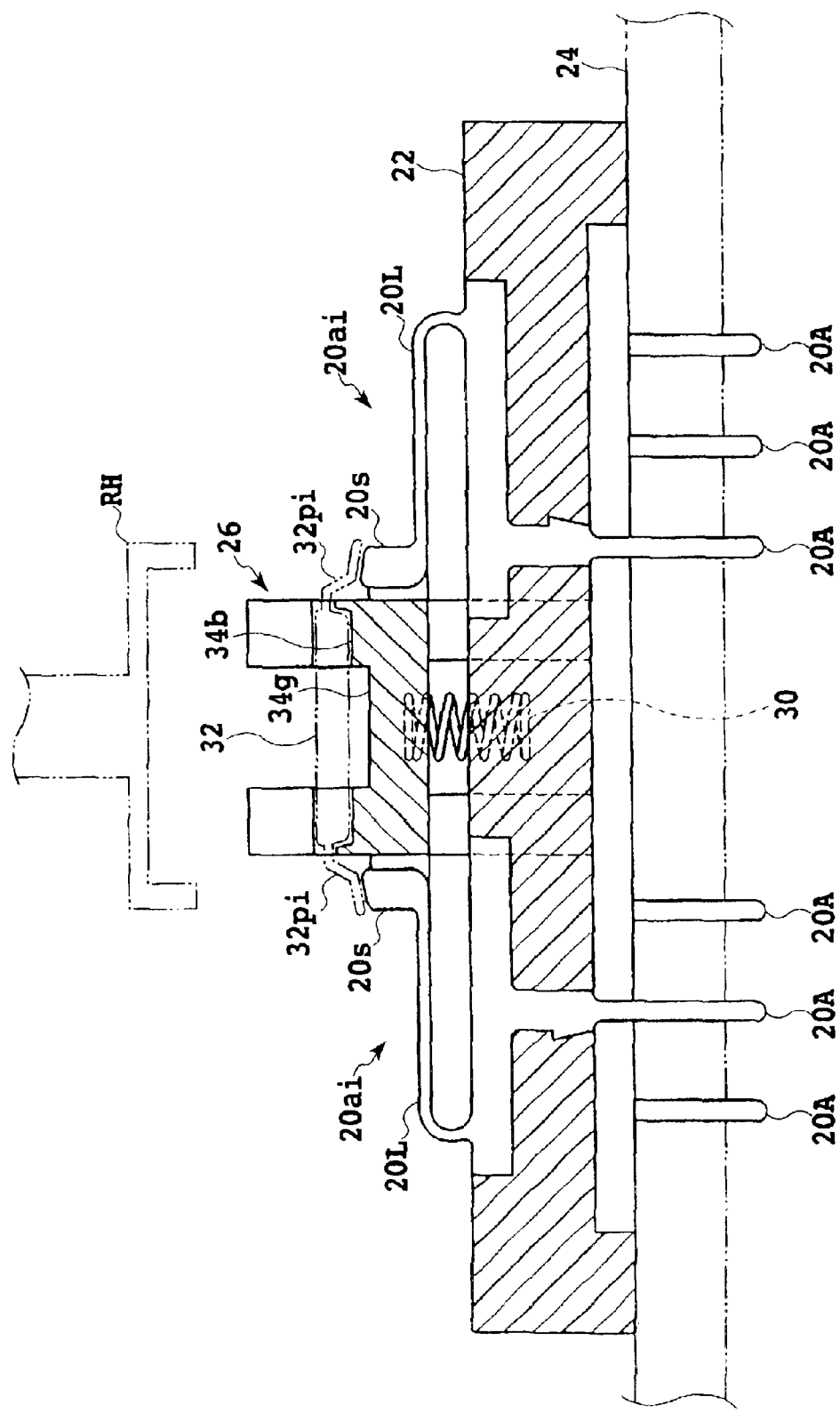
FIG. 3 is a cross sectional view partially taken along line III—III in the example illustrated in FIG. 2.
Figure 4:
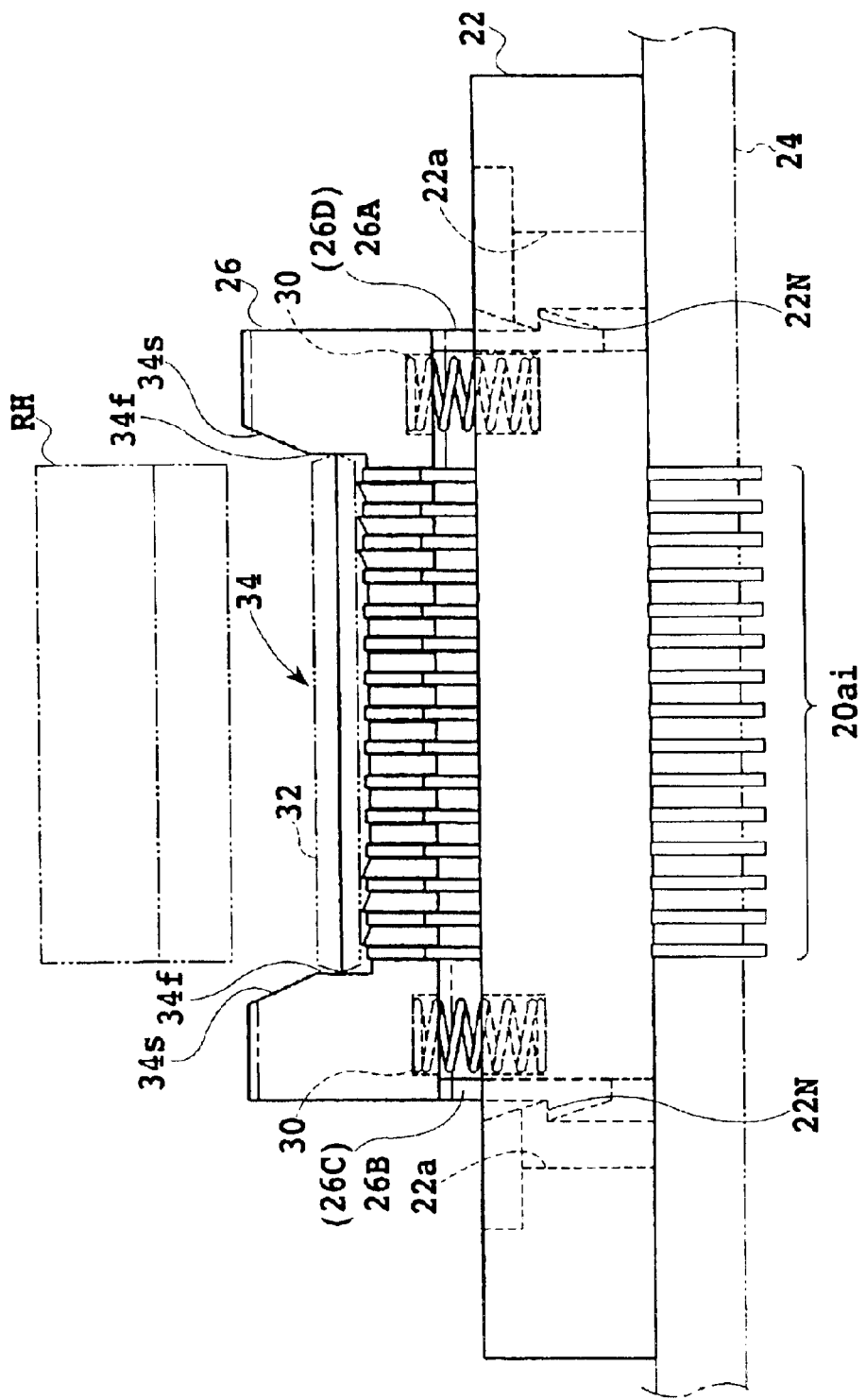
FIG. 4 is a side view in the example illustrated in FIG. 2.

The semiconductor device-socket comprises, as major components, as shown in FIG. 2 and FIG. 4 for example, a base 22 disposed on a printed circuit board 24 that includes an input/output section through which a predetermined inspection signal is inputted and outputted; an object under test-accommodation member 26 which is disposed on the base 22 and in which a semiconductor device 32 (refer to FIG. 3.) as an object under test is accommodated; and a plurality of contact terminals 20$ai$ (i=1 to n, n is a positive integer each for electrically connecting leads of the semiconductor device 32 accommodated in the object under test-accommodation member 26 with electrodes of the printed circuit board 24.

Figure 5:
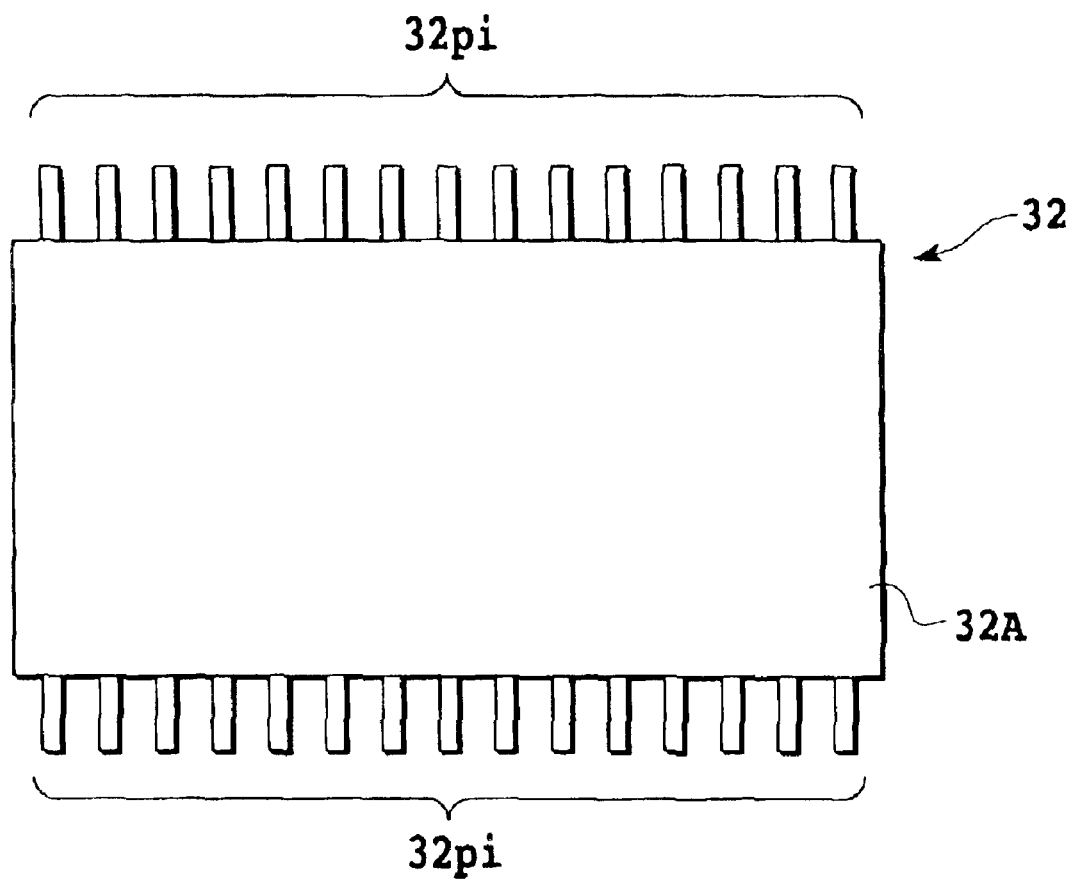
FIG. 5 is an external view of a semiconductor device made available for an example of a semiconductor device-socket according to the present invention.

The semiconductor device 32 is covered with a SOP type package 32A made of heat-resisting resin or ceramic and the like, and includes therein a high-integration semiconductor integrated circuit as an electronic circuit, as illustrated in FIG. 5 for example. To the semiconductor integrated circuit are electrically connected a plurality of leads 32$pi$ as an input/output terminal. The fifteen(15) leads 32$pi$ are protruded from each of opposite side surfaces of the package 32A along its length at a predetermined interval.

The base 22 includes at four positions therein mounting holes 22$a$ into each of which a screw is inserted. The screw (not shown) is used to fix the base 22 onto the printed circuit board 24. The base 22 includes openings 22$b$ at four positions in the central area thereof, into which pawls 26A, 26B, 26C, and 26D of the object under test-accommodation member 26 described later are inserted, respectively. Referring to FIG. 4, on a peripheral edge of each opening 22$b$ is provided a pawl 22N, which is engaged with the pawls 26A, 26B, 26C, and 26D.

Referring to FIG. 3, each thin sheet-shaped contact terminal 20$ai$ comprises: a board-side terminal 20A which is fixed to the base 22 in place on the same and is fixed to the electrodes of the printed circuit board 24; and a contact portion 20$s$ which comes in contact with the leads 32$pi$ of the semiconductor device 32 described later and electrically connects contact terminal 20$ai$ and the lead 32$pi$; and a curved coupling section 20L for coupling the board-side terminal 20A and the contact portion 20s. The contact terminals 20ai are disposed oppositely to each other across the object under test-accommodation member 26 at a predetermined interval. The contact terminals 20ai in each line are disposed at a predetermined interval along the length of the object under test-accommodation member 26, e.g., at an interval between the adjacent leads 32pi of the semiconductor device 32 as above. The contact portion 20s is inserted into the slit in the object under test-accommodation member 26 described later to be engaged with it.

Referring to FIG. 2, the object under test-accommodation member 26 has the four pawls 26A to 26B at the lower end thereof corresponding to the opening 22b. The pawls 26A to 26A are protruded toward the interior of the opening 22b. Further, between the object under test-accommodation member 26 and the base 22 there are provided coiled springs 30 for supporting the object under test-accommodation member 26 at two positions.

The object under test-accommodation member 26 is therefore supported by the coiled spring 30 as the urging member and the contact terminal 20ai at a predetermined distance apart from the base 22, as illustrated in FIG. 3 and FIG. 4.

The object under test-accommodation member 26 includes the accommodating section 34 at the center thereof in which the semiconductor device 32 is accommodated. The accommodating section 34 is formed as to be surrounded in all directions with the inclined guide surface 34s, a bottom surface 34b forming a bottom, and each upright surface 34f intersecting the guide surface 34s and the bottom surface 34b, as illustrated in FIG. 2, FIG. 3, and FIG. 4. In the bottom surface 34b is formed a shallow groove 34g.

Figure 1:
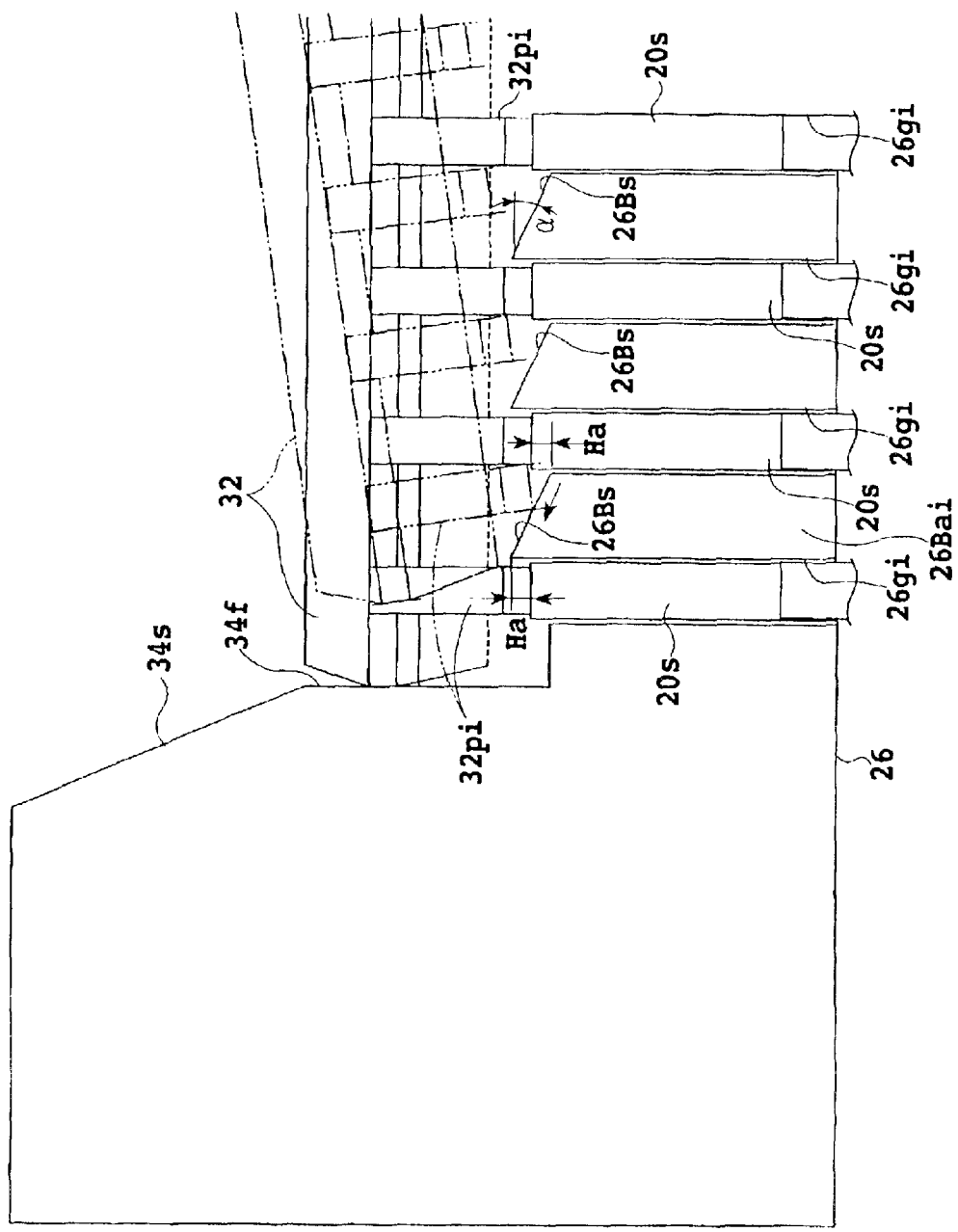
FIG. 1 is a partially enlarged cross sectional view, illustrating a point of an embodiment of a semiconductor device-socket according to the present invention together with a semiconductor device.

A portion of an outer periphery of the accommodating section 34 of the object under test-accommodation member 26 in opposition to the contact terminals 20ai in each line are formed slits 26gi (i=1 to n, n is a positive integer) with which the contact portion 20s of the contact terminal 20ai is engaged respectively, as illustrated in FIG. 1. Each slit 26gi is formed as to extend perpendicularly to the direction of an array of the contact terminals 20ai at a predetermined interval corresponding to an interval between the adjacent leads 32pi of the accommodated semiconductor device 32 for example.

Figure 6:
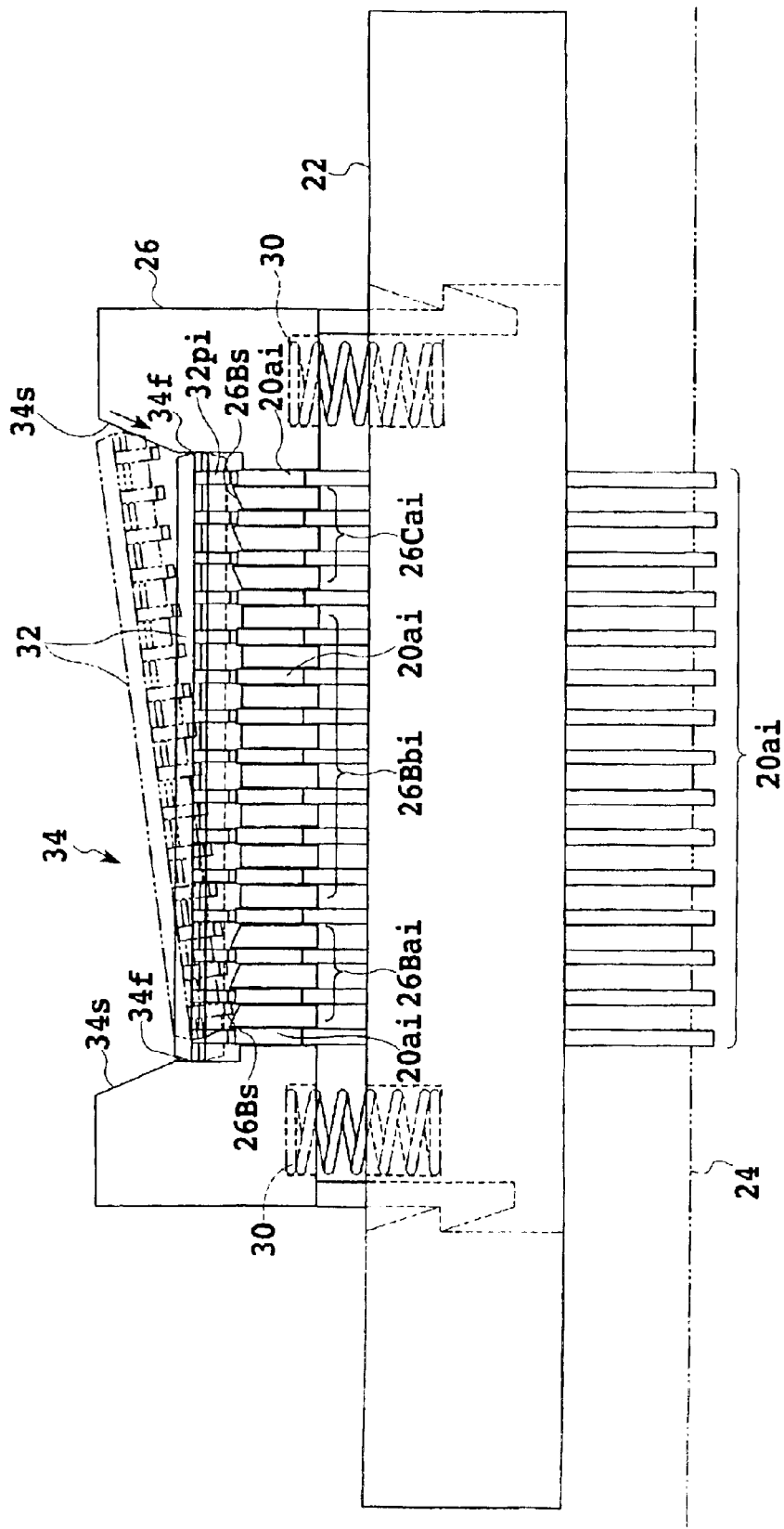
FIG. 6 is a side view made available for the operation explanation of the example illustrated in FIG. 2.
Figure 7:
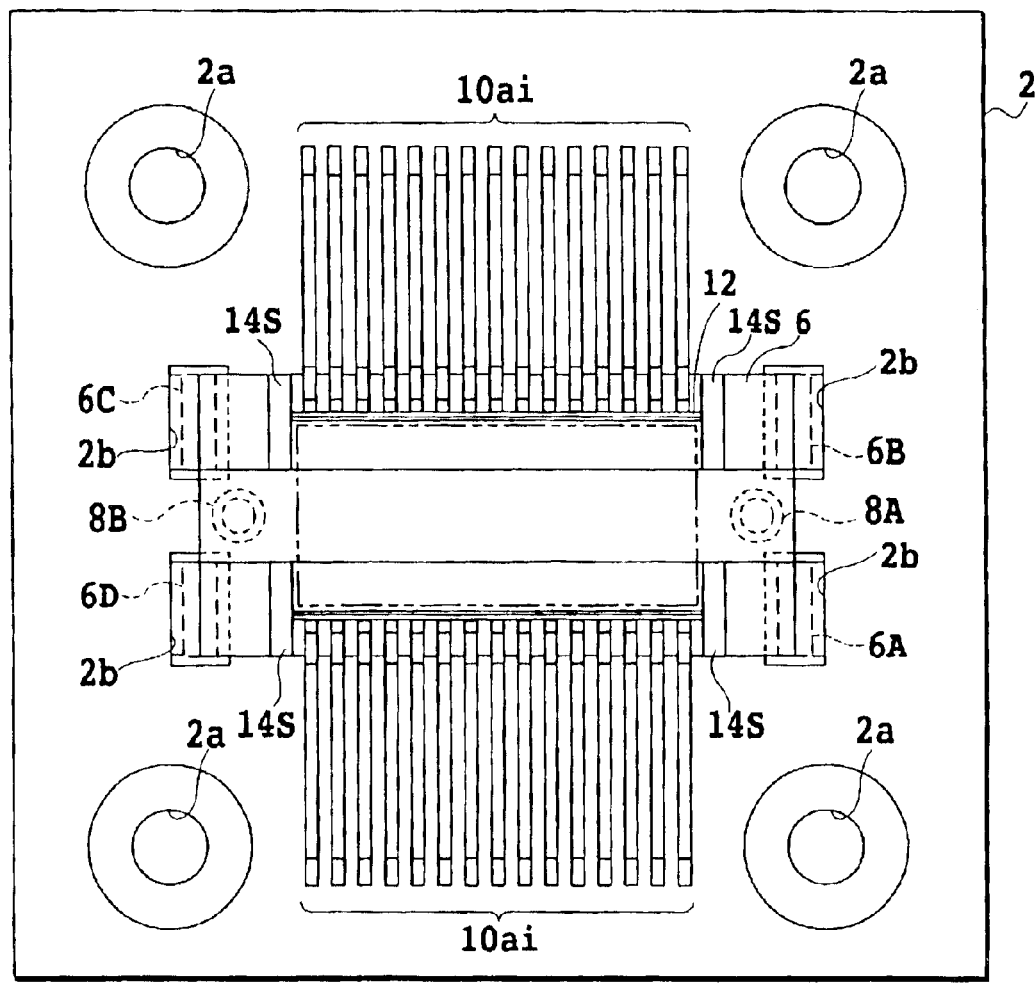
FIG. 7 is a plan view illustrating an outer appearance of a prior art apparatus.
Figure 8:
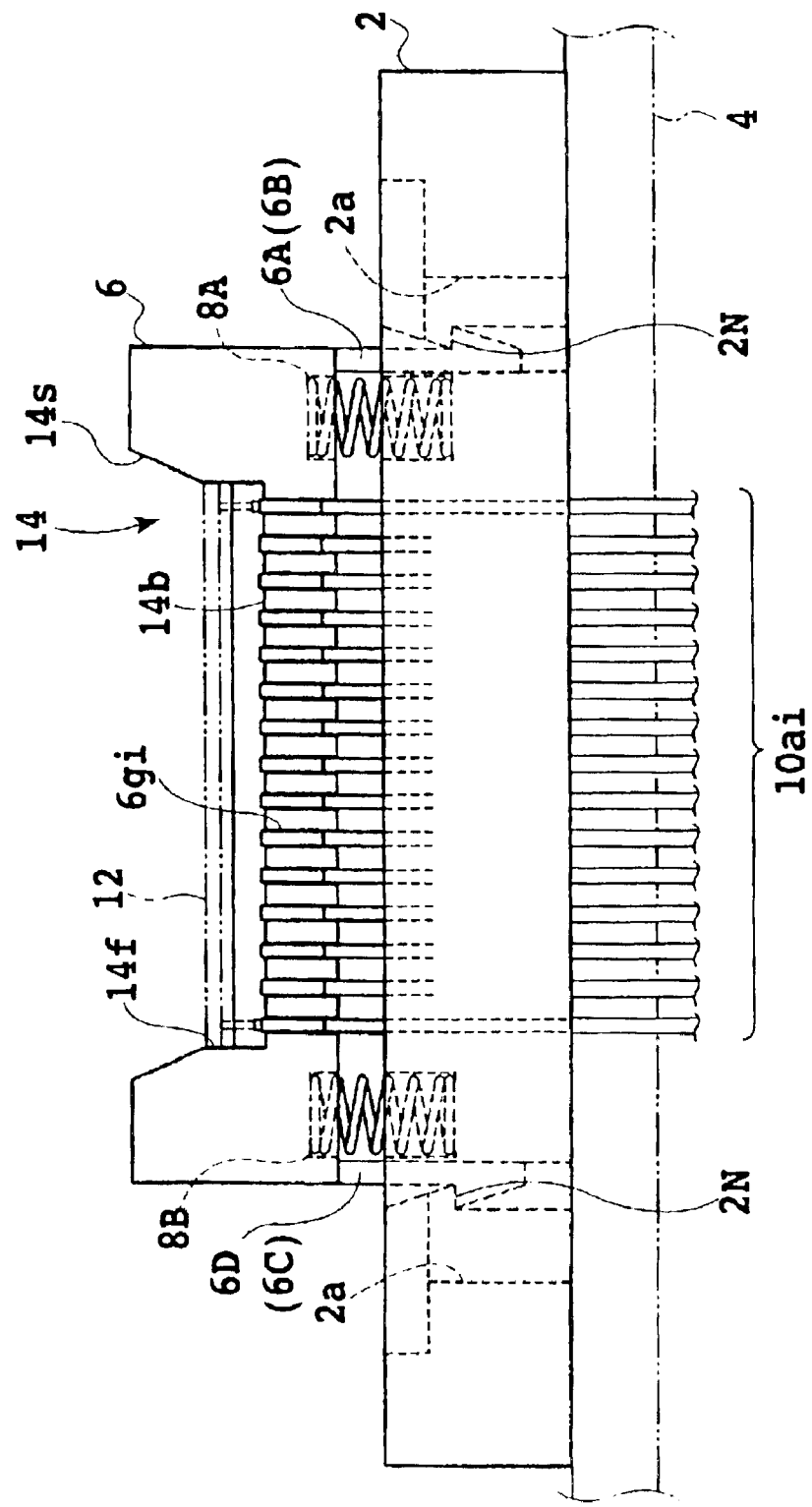
FIG. 8 is a side view illustrating the example illustrated in FIG. 7.
Figure 9:
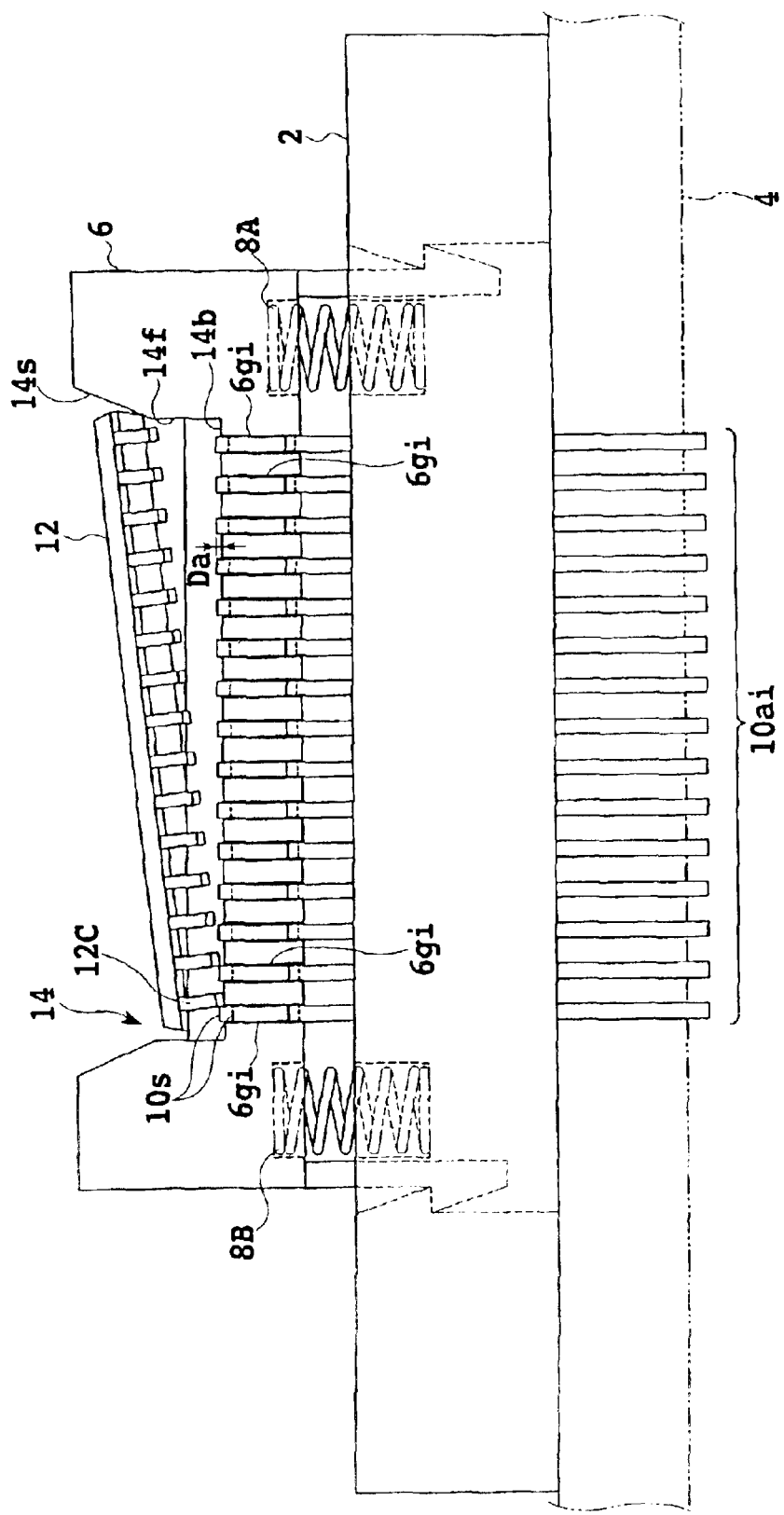
FIG. 9 is a side view made available for the operation explanation of the example illustrated in FIG. 7.

Referring further to FIG. 6, between slits 26gi are formed a partition wall 26Bai, a partition wall 26Bbi, and a partition wall 26Cai (i=1 to n, n is a positive integer) for dividing the adjacent slits 26ai.

Each partition wall 26Bbi is formed in a region corresponding to substantially the central portion of the group of the contact terminals 20ai on each line. The tip end (upper surface) of each partition wall 26Bbi has a flat surface. The upper surface of each partition wall 26Bbi is formed as to define a step height at a position lower than a surface of the contact portion 20s of the contact terminal 20ai with which the lead 32pi comes in contact, for example.

In contrast, the three partition walls 26Bai and 26Cai are formed each for example in regions corresponding to opposite ends of the contact terminals 20ai in each line. The width of each of the partition walls 26Bai and 26Cai in the direction of an array thereof is set to about 0.4 mm to about 1.2 mm for example. The number of the partition walls 26Bai and 26Cai may be set in response to positioning accuracy of a conveying robot that holds the accommodated semiconductor device 32, e.g., at least two or more the partition walls 26Bai and 26Cai may be provided.

The tip end (upper surface) of each partition wall 26Bai, i.e., a portion of the contact terminal 20ai continued to the contact portion 20s (a portion between the contact portions 20s of the adjacent contact terminals 20ai) has a slope 26BS. Referring to FIG. 1, each slope 26BS is set to be a flat surface that couples a portion which is located at a lower position than a surface of the contact portion 20s of the adjacent one contact terminal 20ai with which the lead 32pi comes in contact by a predetermined height Ha, e.g., about 50 μm to about 0.1 mm and a portion that is located at a higher position than a surface of the contact portion 20s of adjacent the other contact terminal 20ai with which the lead 32pi comes in contact by a predetermined height Ha, e.g., about 50 μm to about 0.1 mm. Therefore, each slope 26BS that inclines toward the upper left has an angle of about 4.7 degree or more nor more than about 14 in angle for example in FIG. 1.

In contrast, the tip end of each partition wall 26Cai illustrated in FIG. 6 has a slope 26BS', which inclines toward the upper right. The inclination is the same as that of each slope 26BS for example. The reason that the slope 26BS' inclines toward the upper right is that it takes into consideration positioning of the lead 32pi in place even when the semiconductor device 32 falls in a slanting position for example and the other side lead 32pi falls onto the partition wall 26Cai.

Accordingly, an extension line along the object under test-accommodation member 26 in length on the slope of each partition wall 26Bai intersects the extension line along the object under test-accommodation member 26 in length on the slope of the partition wall 26Cai.

In such a construction, when the semiconductor device 32 is tested the semiconductor device 32 held by a conveying robot (not shown) is disposed in place just above the accommodating section 34 of the object under test-accommodation member 26 and is then dropped from a predetermined height and mounted in the accommodating section 34. Thus, by bringing a package section of the semiconductor device 32 to touch on each upright surface 34f and the bottom surface 34b, the semiconductor device 32 is positioned in the accommodating section 34. Further, each lead 32pi of the semiconductor device 32 is placed on the contact portion 20s of the contact terminal 20ai.

At the time of the placing, as indicated by broken lines in FIG. 1 and FIG. 6, when the semiconductor device 32 falls down in a slanting position and the one side lead 32pi thereof falls on the partition wall 26Bai, the package section of the semiconductor device 32 is guided with the aid of the guide surface 34s and is forced to fall down owing to self weight thereof in the direction of an arrow in FIG. 6, whereby the lead 32pi located at an end of the package section is guided in the direction indicated by the arrow in FIG. 1 with the aid of the slope 26BS and is moved onto the contact portion 20s of the adjacent contact terminal 20ai. Further, the package section of the semiconductor device 32 is brought into a contact with each upright surface 34.

Accordingly, even when the semiconductor device 32 falls down in the slanting position, each lead 32pi is positioned onto the contact portion 20s of each contact terminal 20ai.

Referring further to FIG. 3, in the state where each lead 32pi is brought into intimate contact with the contact portion 20s of each contact terminal 20ai by being pressed by a robot hand RH, a predetermined inspection signal is supplied to the semiconductor device 32 in a predetermined atmosphere through the printed circuit board 24 and the group of the contact terminals 20ai, thereby executed a test on the semiconductor device 32.

Although in the aforementioned embodiment, when the semiconductor device 32 falls down in the slanting position, each lead 32pi of the semiconductor device 32 is guided along the slope 26BS owing to its self weight and is moved onto the contact portion 20s of the adjacent contact terminal 20ai, but not necessarily, such a example, and it may be constructed such that an end of the package located at a higher position in the semiconductor device 32 may be further pressed along the guide surface 34S in addition to the self weight, for example.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A semiconductor device-socket comprising:
   a plurality of slits, each of which is formed adjacent to a semiconductor device accommodating section in which a semiconductor device having a plurality of leads is accommodated, corresponding to an array of said leads, each said slit engaged with a contact terminal having a contact portion connectable electrically to a respective lead; and
   a plurality of partition walls each formed adjacent to said semiconductor device accommodating section to define adjacent slits;
   wherein at least one said partition wall among said plurality of the partition walls includes an end section extending from a first slit to a second slit with an angular slope extending from an uppermost portion to a lowermost portion, said uppermost portion higher in position than the contact portion of the contact terminal engaged with the first slit and said lowermost portion lower in position than the contact portion of the contact terminal engaged with the second slit.

2. A semiconductor device-socket according to claim 1 wherein said angular slope of the partition wall is formed at a portion corresponding to the vicinity of at least one end around said semiconductor device accommodating section in the direction of an array of said plurality of the slits.

3. A semiconductor device-socket according to claim 1 wherein said semiconductor device accommodating section has a guide surface into which said semiconductor device to be accommodated is guided thereto.

4. A semiconductor device-socket comprising:
   a plurality of contact terminals having contact portions connectable electrically to each lead of a semiconductor device having a plurality of leads;
   an object under test-accommodation member including: a semiconductor device accommodating section in which said semiconductor device is accommodated, a plurality of slits formed adjacent to said semiconductor device accommodating section corresponding to an array of said leads and each engaged with said contact terminals; and a plurality of partition walls each formed to define adjacent slits; and
   a base for supporting said contact terminal and said object under test-accommodation member;
   wherein at least one partition wall among said plurality of the partition walls includes an end section extending from a first slit to a second slit with an angular slope extending from an uppermost portion a lowermost portion, said uppermost portion higher in position than the contact portion of the contact terminal engaged with the first slit and said lowermost portion lower in position than the contact portion of the contact terminal engaged with the second slit.

5. A semiconductor device-socket according to claim 4 wherein an upper end surface of said partition wall among said plurality of the partition walls in a region corresponding to the position of a substantially central portion of said object under test-accommodation member is a substantially flat surface.

6. A semiconductor device-socket according to claim 4 wherein said object under test-accommodation member is supported at an upper position of said base with the aid of an urging member disposed between said object under test-accommodation member and said base.

7. A semiconductor device-socket according to claim 4 wherein said semiconductor device includes an SOP type-package.

8. A semiconductor device-socket according to claim 4 wherein a longitudinal extension line on each of the angular slopes of the plurality of the partition walls located in a region corresponding to a position in the vicinity of longitudinal one end of said object under test-accommodation member among said plurality of the partition walls intersects a longitudinal extension line on each of the angular slopes of the plurality of the partition walls in a region corresponding to a position located in the vicinity of the longitudinal other end of said object under test-accommodation member.

9. A semiconductor device-socket according to claim 8 wherein the angular slopes of a plurality of said partition walls located in a region corresponding to a position located in the vicinity of longitudinal one end of said object under test-accommodation member among said plurality of the partition walls is a slope inclining toward the upper left, while the angular slopes of a plurality of the partition walls located in a region corresponding to a position in the vicinity of the other longitudinal end of said object under test-accommodation member is a slope inclining toward the upper right.

10. A semiconductor device-socket comprising:
    a plurality of slits, each of which is formed adjacent to a semiconductor device accommodating section in which a semiconductor device having a plurality of leads is accommodated, corresponding to an array of said leads, said slit engaged with contact terminals each having a contact portion connected electrically to said lead respectively; and
    a plurality of partition walls each formed adjacent to said semiconductor device accommodating section to define adjacent said slits;
    wherein at least one said partition wall among said plurality of the partition walls includes a slope that connects the uppermost end located at a higher position than the position of a contact portion of a first contact terminal among said contact terminals and the lowest end located at a lower position than the position of a contact portion of a second contact terminal adjacent to said first contact terminal; and
    wherein said slope of the partition wall is formed at a portion corresponding to the vicinity of at least one end around said semiconductor device accommodating section in the direction of an array of said plurality of slits.

11. A semiconductor device-socket comprising:
    a plurality of contact terminals having contact portions connectable electrically to each lead of a semiconductor device having said plurality of leads;

an object under test-accommodation member including:
- a semiconductor device accommodating section in which said semiconductor device is accommodated;
- a plurality of slits formed adjacent to said semiconductor device accommodating section corresponding to an array of said leads and each engaged with said contact terminals; and
- a plurality of partition walls each formed to define adjacent slits; and a base for supporting said contact terminal and said object under test-accommodation member;

wherein at least one partition wall among said plurality of the partition walls has a slope that connects an uppermost end located at a higher position than the position of the contact portion of a first contact terminal among said contact terminals and a lowest end located at a lower position than the position of the contact portion of an adjacent second contact terminal adjacent to said first contact terminal; and wherein an upper end surface of said partition wall among said plurality of the partition walls in a region corresponding to the position of a substantially central portion of said object under test-accommodation member is a substantially flat surface.

12. A semiconductor device-socket comprising:

a plurality of contact terminals having contact portions connectable electrically to each lead of a semiconductor device having said plurality of leads;

an object under test-accommodation member including:
- a semiconductor device accommodating section in which said semiconductor device is accommodated;
- a plurality of slits formed adjacent to said semiconductor device accommodating section corresponding to an array of said leads and each engaged with said contact terminals; and
- a plurality of partition walls each formed to define adjacent slits; and a base for supporting said contact terminal and said object under test-accommodation member;

wherein at least one partition wall among said plurality of the partition walls has a slope that connects an uppermost end located at a higher position than the position of the contact portion of a first contact terminal among said contact terminals and a lowest end located at a lower position than the position of the contact portion of an adjacent second contact terminal adjacent to said first contact terminal; and wherein a longitudinal extension line on each of the slopes of the plurality of the partition walls located in a region corresponding to a position in the vicinity of longitudinal one end of said object under test-accommodation member among said plurality of the partition walls intersects a longitudinal extension line on each of the slopes of the plurality of the partition walls in a region corresponding to a position located in the vicinity of the longitudinal other end of said object under test-accommodation member.

13. A semiconductor device-socket comprising:

a plurality of contact terminals having contact portions connectable electrically to each lead of a semiconductor device having said plurality of leads;

an object under test-accommodation member including:
- a semiconductor device accommodating section in which said semiconductor device is accommodated;
- a plurality of slits formed adjacent to said semiconductor device accommodating section corresponding to an array of said leads and each engaged with said contact terminals; and
- a plurality of partition walls each formed to define adjacent slits; and a base for supporting said contact terminal and said object under test-accommodation member;

wherein at least one partition wall among said plurality of the partition walls has a slope that connects an uppermost end located at a higher position than the position of the contact portion of a first contact terminal among said contact terminals and a lowest end located at a lower position than the position of the contact portion of an adjacent second contact terminal adjacent to said first contact terminal;

wherein a longitudinal extension line on each of the slopes of the plurality of the partition walls located in a region corresponding to a position in the vicinity of longitudinal one end of said object under test-accommodation member among said plurality of the partition walls intersects a longitudinal extension line on each of the slopes of the plurality of the partition walls in a region corresponding to a position located in the vicinity of the longitudinal other end of said object under test-accommodation member; and wherein slopes of a plurality of said partition walls located in a region corresponding to a position located in the vicinity of longitudinal one end of said object under test-accommodation member among said plurality of the partition walls is a slope inclining toward the upper left, while slopes of a plurality of the partition walls located in a region corresponding to a position in the vicinity of the other longitudinal end of said object under test-accommodation member is a slope inclining toward the upper right.

* * * * *

UNITED STATES PATENT AND TRADEMARK OFFICE
CERTIFICATE OF CORRECTION

PATENT NO. : 6,824,395 B2
DATED : November 30, 2004
INVENTOR(S) : Kazumi Uratsuji It is certified that error appears in the above-identified patent and that said Letters Patent is hereby corrected as shown below:

Column 7,
Line 67, insert -- to -- after "portion".

Signed and Sealed this

Seventeenth Day of May, 2005

JON W. DUDAS
*Director of the United States Patent and Trademark Office*